US009773798B2

(12) United States Patent
Han

(10) Patent No.: US 9,773,798 B2
(45) Date of Patent: Sep. 26, 2017

(54) SEMICONDUCTOR DEVICE AND MANUFACTURING METHOD THEREOF

(71) Applicant: SK hynix Inc., Gyeonggi-do (KR)

(72) Inventor: Kwang Hee Han, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/150,249

(22) Filed: May 9, 2016

(65) Prior Publication Data

US 2017/0179144 A1 Jun. 22, 2017

(30) Foreign Application Priority Data

Dec. 21, 2015 (KR) .......................... 10-2015-0182898

(51) Int. Cl.
| | |
|---|---|
| *H01L 23/52* | (2006.01) |
| *H01L 27/11565* | (2017.01) |
| *H01L 27/11568* | (2017.01) |
| *H01L 27/11582* | (2017.01) |
| *H01L 23/522* | (2006.01) |
| *H01L 23/528* | (2006.01) |
| *H01L 23/532* | (2006.01) |
| *H01L 21/768* | (2006.01) |

(52) U.S. Cl.
CPC .. *H01L 27/11565* (2013.01); *H01L 21/76816* (2013.01); *H01L 21/76877* (2013.01); *H01L 23/528* (2013.01); *H01L 23/5226* (2013.01); *H01L 23/53257* (2013.01); *H01L 27/11568* (2013.01); *H01L 27/11582* (2013.01)

(58) Field of Classification Search
CPC ......... H01L 27/11565; H01L 21/76816; H01L 21/76877; H01L 23/5226; H01L 23/528; H01L 23/53257; H01L 27/11568; H01L 27/11582
See application file for complete search history.

(56) References Cited

U.S. PATENT DOCUMENTS

| | | | | |
|---|---|---|---|---|
| 7,994,011 B2* | 8/2011 | Park | ................. | H01L 27/11578 257/329 |
| 8,748,966 B2* | 6/2014 | Whang | ............. | H01L 27/11556 257/314 |
| 2006/0273298 A1* | 12/2006 | Petti | ..................... | H01L 27/2481 257/5 |
| 2007/0158736 A1* | 7/2007 | Arai | ....................... | H01L 27/105 257/315 |
| 2010/0308391 A1* | 12/2010 | Kim | .................... | H01L 29/7926 257/314 |

(Continued)

FOREIGN PATENT DOCUMENTS

| | | |
|---|---|---|
| KR | 1020110015339 | 2/2011 |
| KR | 1020140035084 | 3/2014 |

*Primary Examiner* — Nicholas Tobergte
(74) *Attorney, Agent, or Firm* — IP & T Group LLP

(57) ABSTRACT

A semiconductor device includes channel layers arranged in a first direction and a second direction intersecting the first direction; stacked insulating layers surrounding sidewalls of the channel layers; stacked gate electrodes interposed between the insulating layers, the gate electrodes respectively surrounding the channel layers; and stacked gate lines interposed between the insulating layers, the gate lines electrically connecting the gate electrodes to each other.

20 Claims, 18 Drawing Sheets

(56) References Cited

U.S. PATENT DOCUMENTS

| | | | |
|---|---|---|---|
| 2014/0061750 A1* | 3/2014 | Kwon | H01L 27/1052 257/314 |
| 2014/0070300 A1* | 3/2014 | Jang | H01L 27/11565 257/324 |
| 2015/0137210 A1* | 5/2015 | Nam | H01L 27/11582 257/324 |
| 2015/0145014 A1* | 5/2015 | Shin | H01L 27/11563 257/314 |
| 2015/0145016 A1* | 5/2015 | Son | H01L 27/11551 257/315 |
| 2015/0221666 A1* | 8/2015 | Lee | H01L 29/66833 257/66 |
| 2016/0268301 A1* | 9/2016 | Lee | H01L 27/11582 |

* cited by examiner

A-A'

B-B'

A-A'

B-B'

A-A'

B-B'

A-A'

B-B'

A-A'

B-B'

SEMICONDUCTOR DEVICE AND MANUFACTURING METHOD THEREOF

CROSS-REFERENCE TO RELATED APPLICATION

The present application claims priority to a Korean patent application number 10-2015-0182898 filed on Dec. 21, 2015 which is incorporated herein in its entirety by reference.

BACKGROUND

1. Field

An aspect of the present disclosure relates generally to a semiconductor electronic device and a manufacturing method thereof and, more particularly, to a three-dimensional semiconductor device and a manufacturing method thereof.

2. Description of the Related Art

A nonvolatile memory device maintains stored data even when a power supply to the device is interrupted. Recently, as the pace of improvement of the degree of integration of a two-dimensional non-volatile memory device in which memory cells are formed in a single layer on a substrate has reached a plateau, a three-dimensional structure has been proposed for nonvolatile memory devices in which memory cells are vertically stacked on a substrate.

Typically, a three-dimensional nonvolatile memory device includes interlayer dielectric layers and gate electrodes, which are alternately stacked, and vertical channel layers penetrating the interlayer dielectric layers and the gate electrodes. Memory cells are stacked along the channel layers. In a typical manufacturing process of a three-dimensional non-volatile memory device, a plurality of oxide layers and a plurality of nitride layers are alternately stacked, and the plurality of nitride layers are replaced with a plurality of conductive layers, thereby forming stacked gate electrodes.

However, generally, replacing the nitride layers with conductive layers is rather cumbersome. Moreover, a reaction gas generated during the replacement process may remain in the stacked structure which may damage peripheral layers. Therefore, certain characteristics of the memory device may be degraded.

SUMMARY

Embodiments of the present invention provide semiconductor device and a manufacturing process for making the semiconductor device that overcomes the aforementioned problems associated with existing semiconductor devices. The present invention provides a simpler manufacturing method for making a three-dimensional semiconductor device which exhibits an improved, more stable structure and improved more stable characteristics than existing semiconductor devices.

According to an aspect of the present disclosure, there is provided a semiconductor device including: channel layers arranged in a first direction and a second direction intersecting the first direction; stacked insulating layers surrounding sidewalk of the channel layers; stacked gate electrodes interposed between the insulating layers, the gate electrodes respectively surrounding the channel layers; and stacked gate lines interposed between the insulating layers, the gate lines electrically connecting the gate electrodes to each other.

According to an aspect of the present disclosure, there is provided a semiconductor device including: semiconductor pillars arranged in a first direction and a second direction intersecting the first direction; stacked insulating layers surrounding sidewalls of the semiconductor pillars; and metal layers including cylindrical metal patterns respectively surrounding the sidewalls of the semiconductor pillars and a metal line surrounding sidewalls of the metal patterns, the metal layers alternately stacked with the insulating layers.

According to an aspect of the present disclosure, there is provided a method of manufacturing a semiconductor device, the method including: alternately forming sacrificial layers and insulating layers; forming first openings passing through the sacrificial layers and the insulating layers, the first openings being arranged in a first direction and a second direction intersecting the first direction; forming second openings by partially removing the sacrificial layers exposed through the first openings; forming gate electrodes in the second openings; forming channel layers in the first openings; forming a slit passing through the sacrificial layers and the insulating layers; forming third openings by removing the sacrificial layers through the slit; and forming, in the third openings, gate lines electrically connecting the gate electrodes to each other.

BRIEF DESCRIPTION OF THE DRAWINGS

Example embodiments of the present invention will now be described more fully hereinafter with reference to the accompanying drawings; however, we note that the present invention may be embodied in different forms and should not be construed as being limited to the embodiments set forth herein. Rather, these embodiments are provided so that this disclosure will be thorough and complete, and will fully convey the present invention to those skilled in the relevant art.

In the drawing figures, dimensions may be exaggerated for clarity of illustration. It be understood that when an element is referred to as being "between" two elements, it can be the only element between the two elements, or one or ore intervening elements may also be present. Like reference numerals refer to like elements throughout.

Figure 1A:
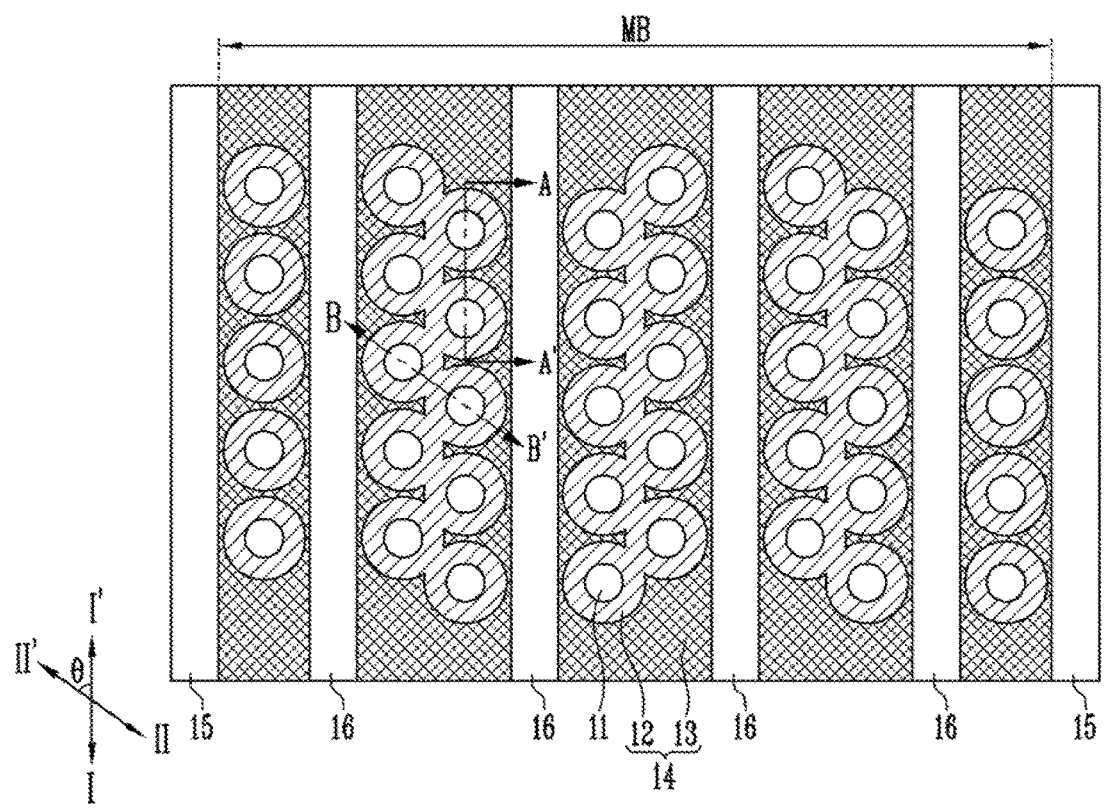
Figure 1B:
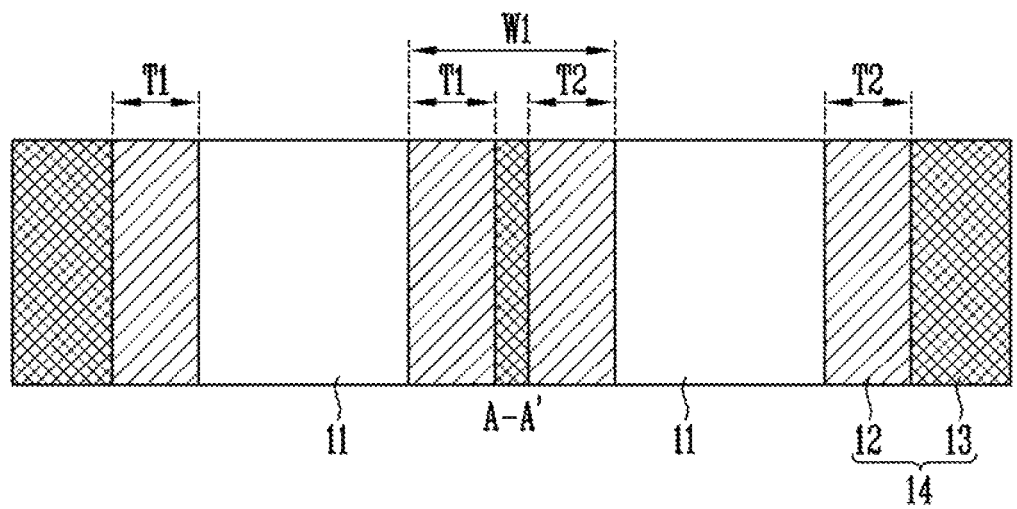
Figure 1C:
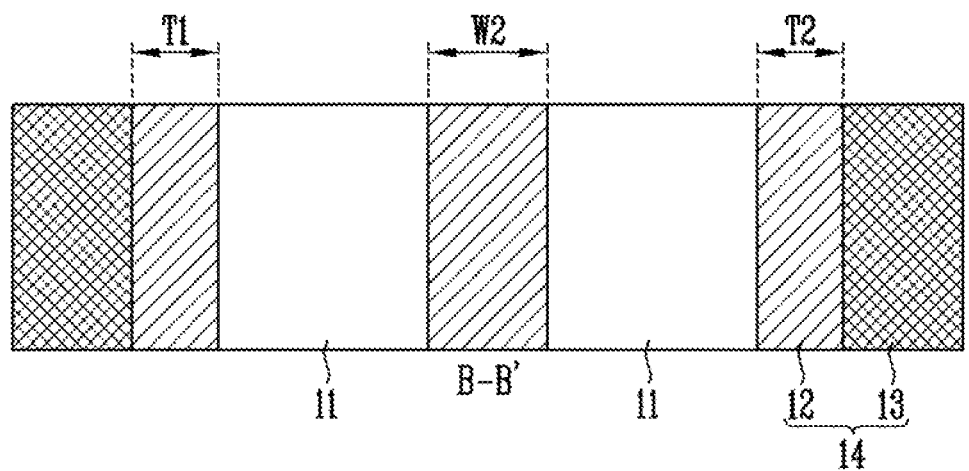
Figure 2A:
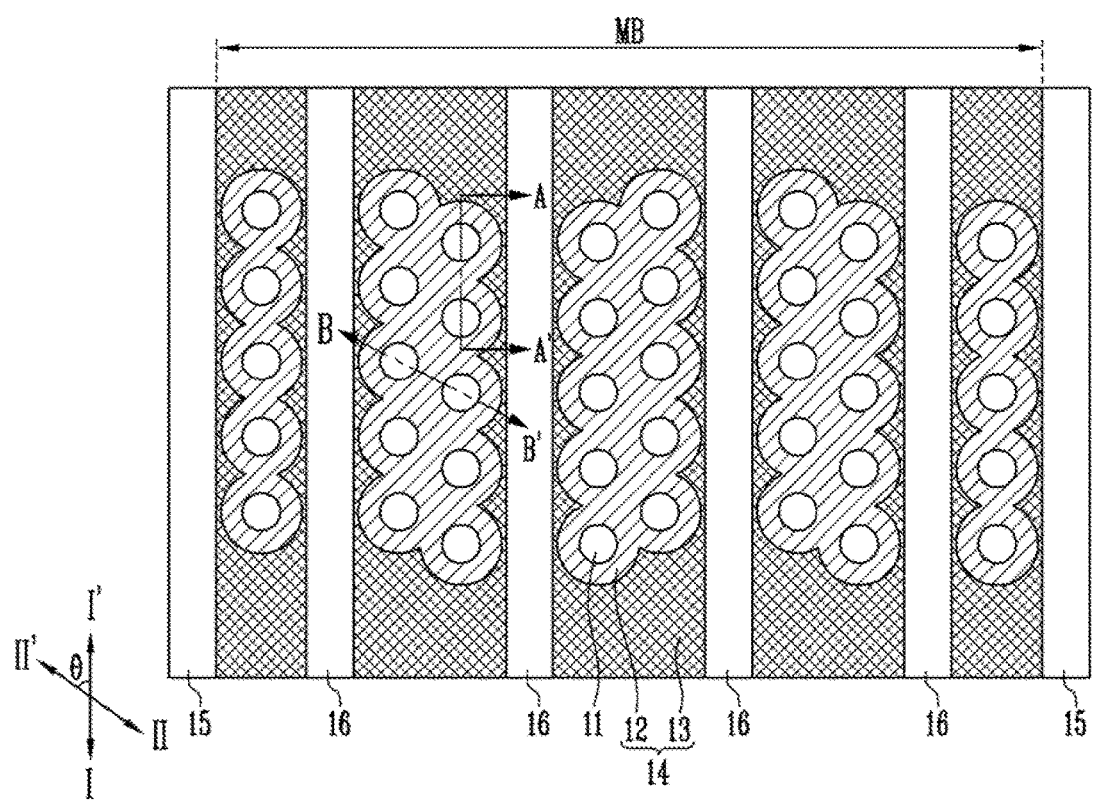
Figure 2B:
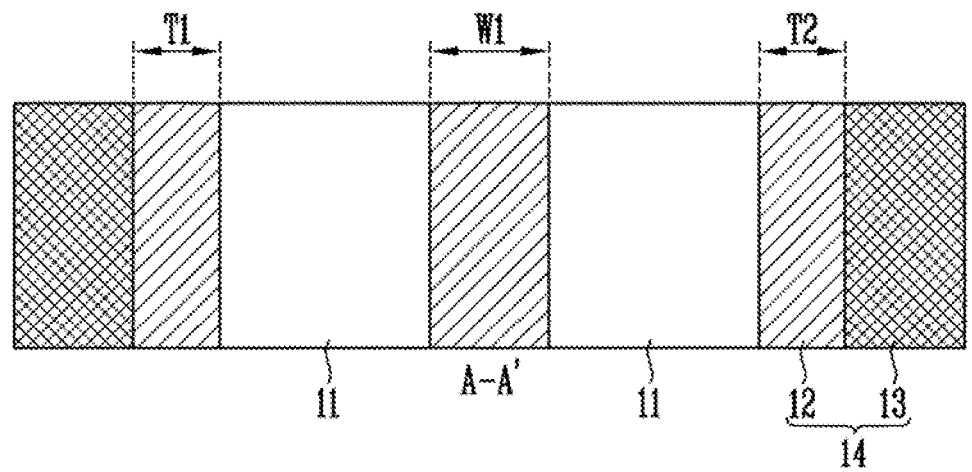
Figure 2C:
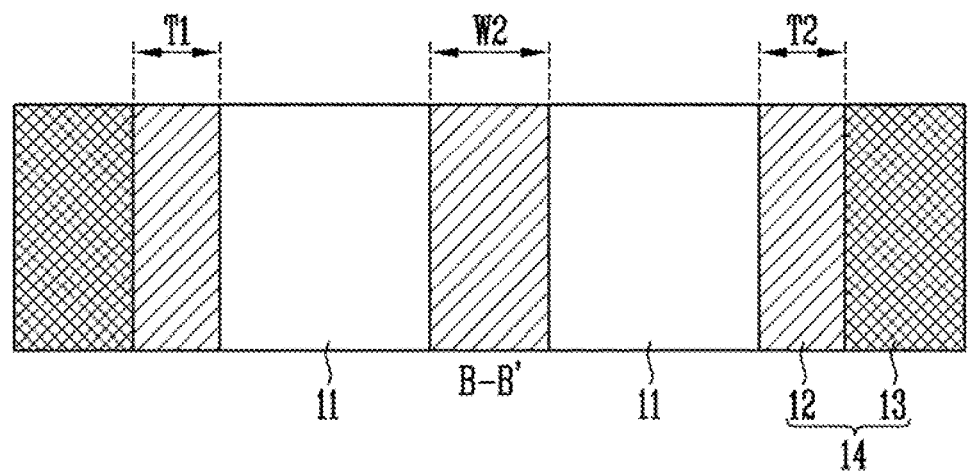
Figure 11A:
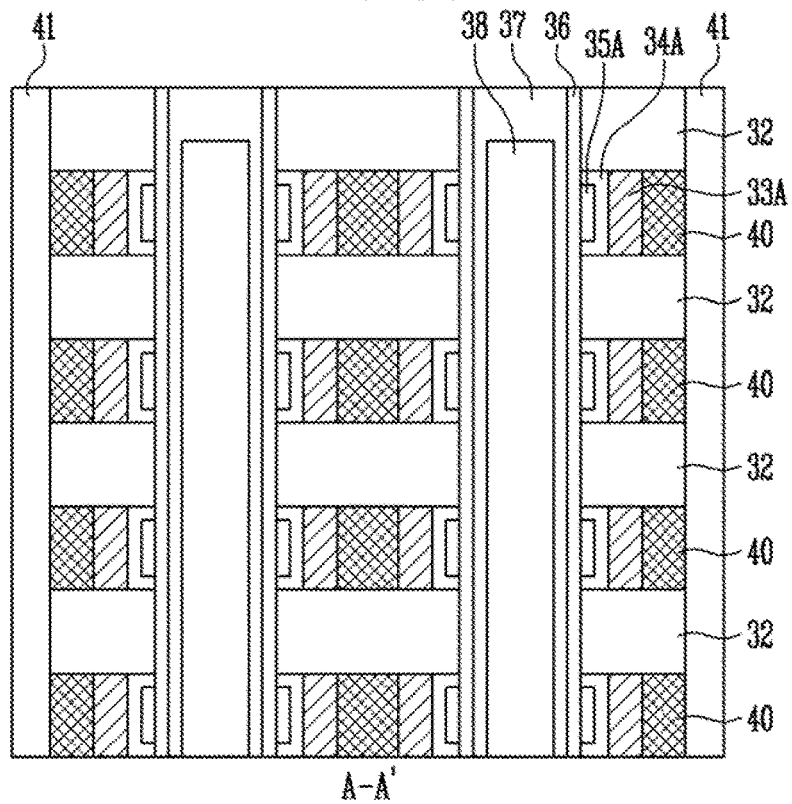
Figure 11B:
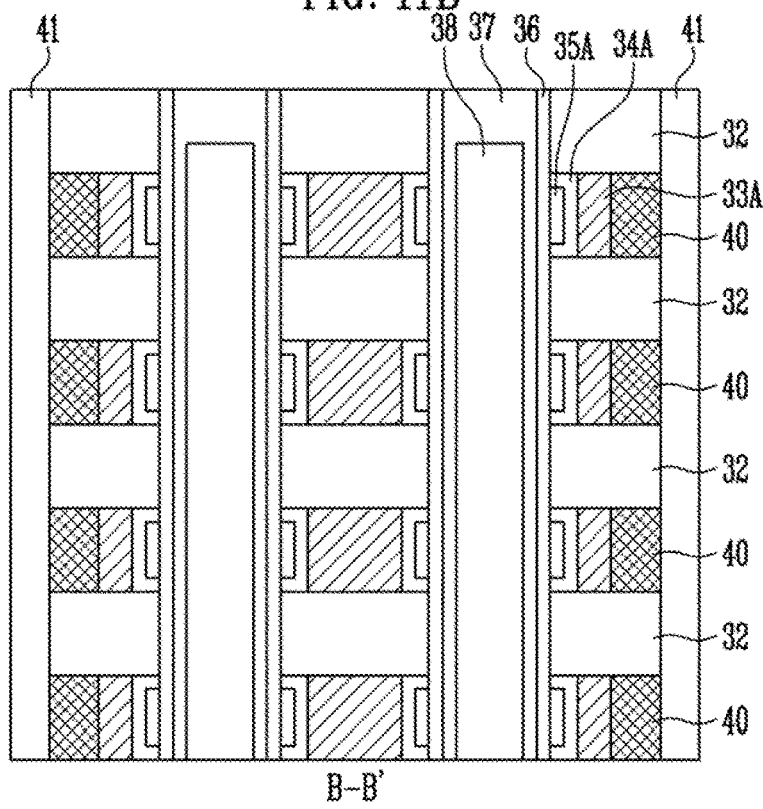
Figure 11C:
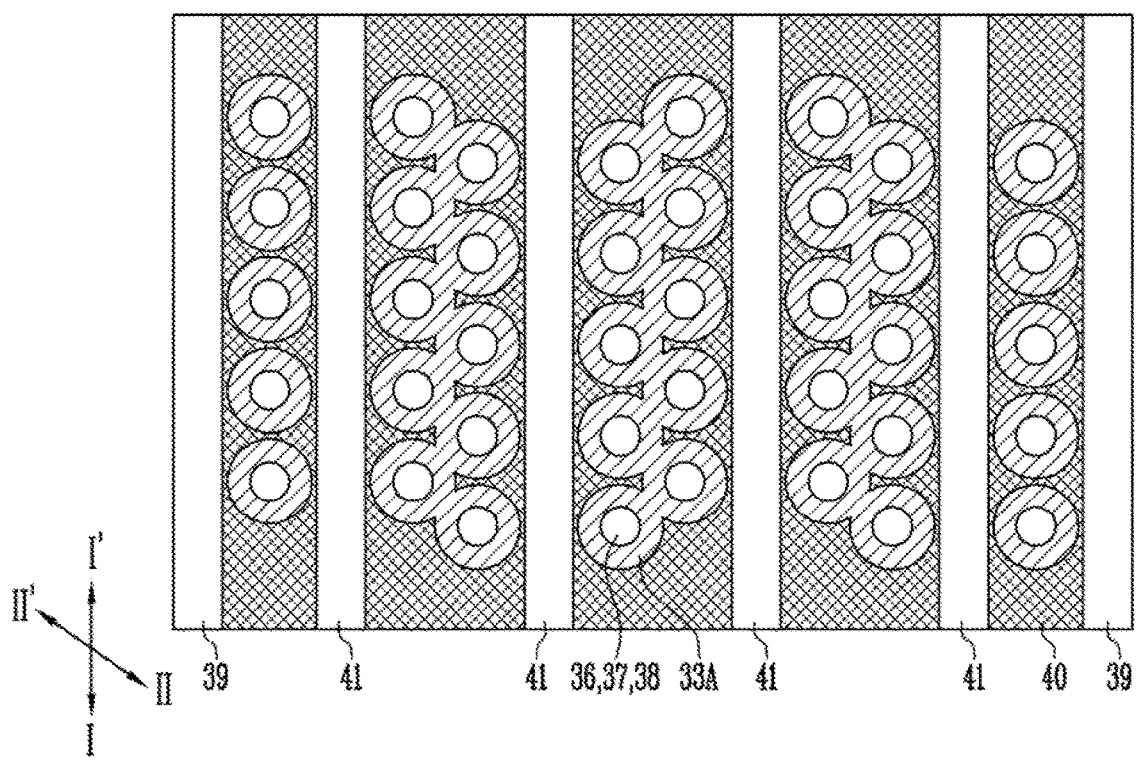
Figure 12:
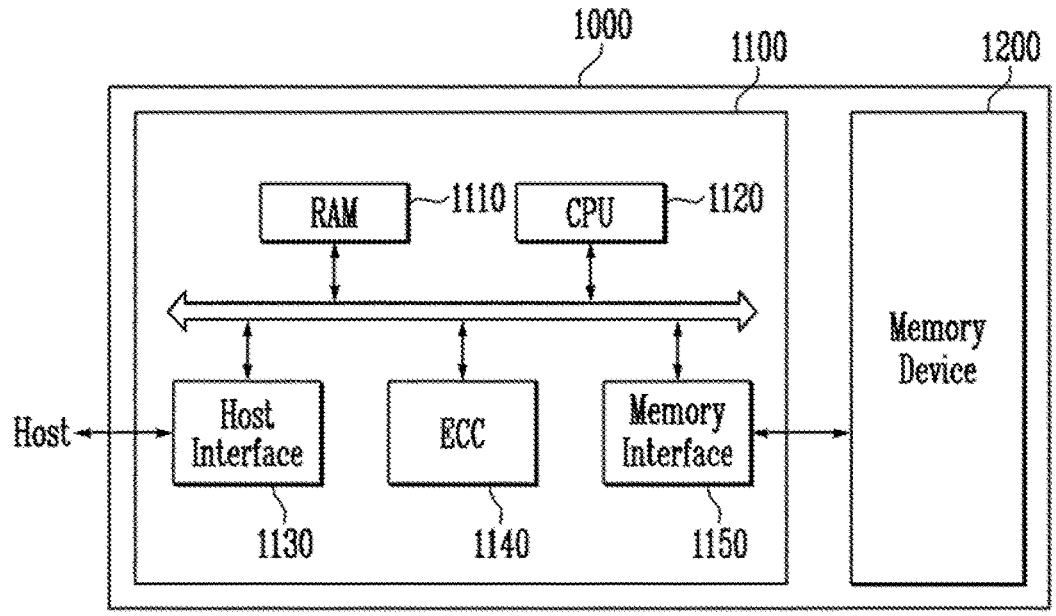
Figure 13:
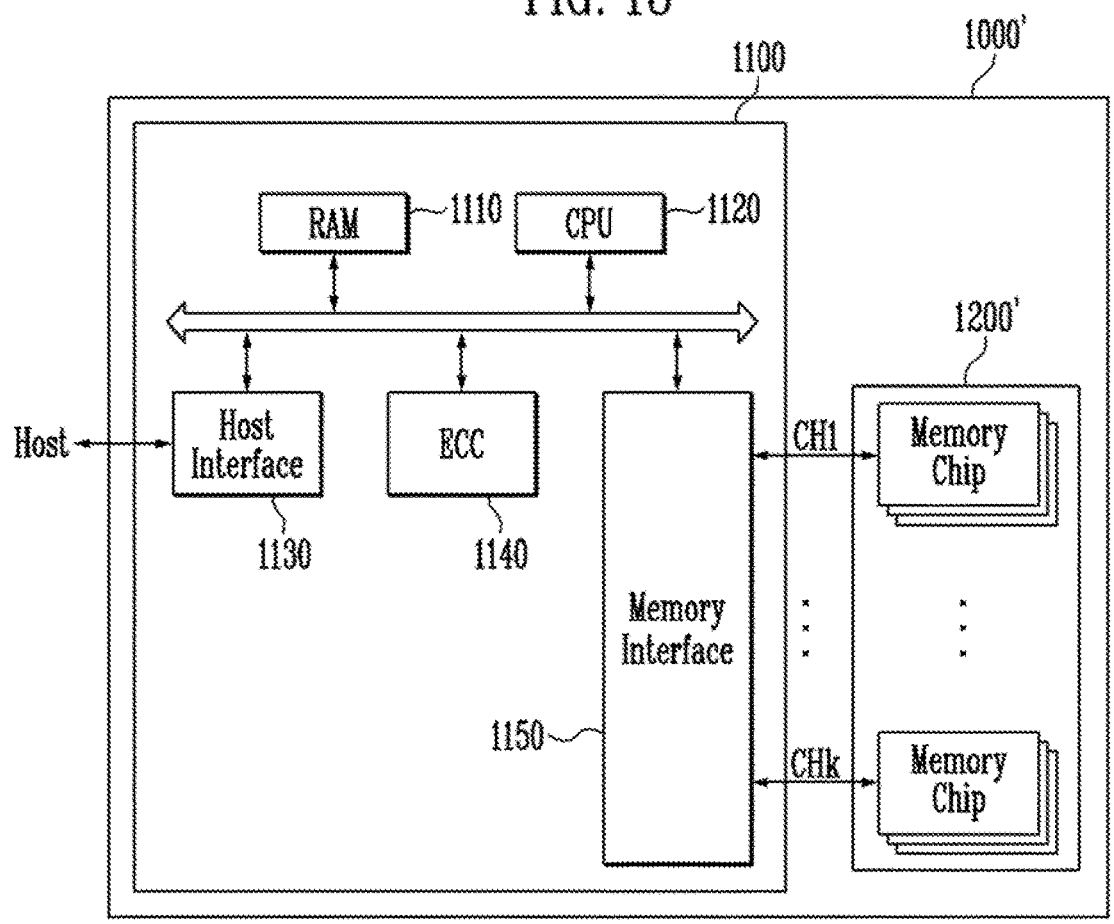
Figure 14:
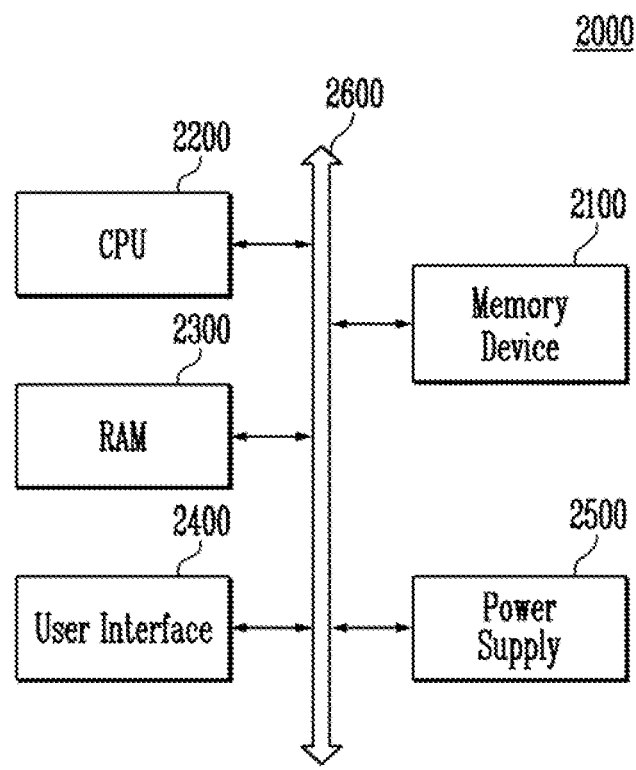
Figure 15:
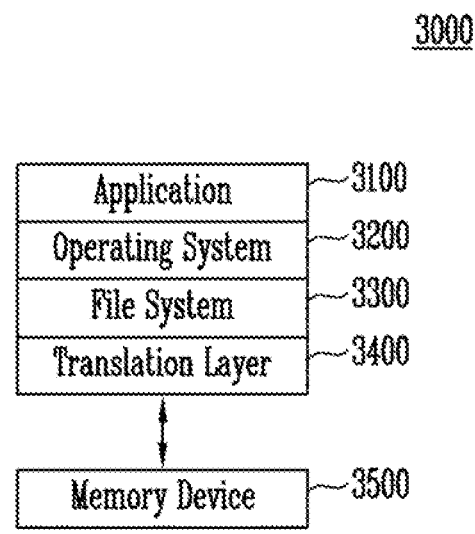

Hereinafter, the various embodiments of the present disclosure will be described in details with reference to the attached drawings, wherein:

FIGS. 1A to 1C are schematic views illustrating a structure of a semiconductor device, according to an embodiment of the present invention FIGS. 2A to 2C are schematic views illustrating a structure of a semiconductor device, according to an embodiment of the present invention FIGS. 3A to 11A, 3B to 116, and 9C to 11C are schematic sectional views illustrating a manufacturing method of a semiconductor device, according to an embodiment of the present invention FIGS. 12 and 13 are block diagrams illustrating configurations of memory systems, according to embodiments of the present invention FIGS. 14 and 15 are block diagrams illustrating computing systems, according to embodiments of the present invention

DETAILED DESCRIPTION

The present disclosure will be described with reference to the accompanying drawings, in which various embodiments of the present disclosure are shown. In the drawings, thicknesses and spaces may be exaggerated corn pared to actual physical thicknesses and spaces. In the description, known configurations that are not central to the gist of the present disclosure may be omitted. In the figures, like numerals refer to like components.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention It will be further understood that when an element is referred to as being "connected to", or "coupled to" another element, it may be directly on, connected to, or coupled to the other element, or one or more intervening elements may be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may, however, be practiced without some or all of these specific details. In other instances, well-known process structures and/or processes have not been described in detail in order not to unnecessarily obscure the present invention Further, as it would be apparent to one of ordinary skill in the art elements described in connection with an embodiment may be used singly or in combination with another embodiment unless otherwise specifically indicated.

FIGS. 1A to 1C illustrating various views of a structure of a semiconductor device, according to an embodiment of the present invention. Particularly, FIG. 1A shows a layout of conductive layers, FIG. 16 shows a sectional view taken along line A-A' of FIG. 1A, and FIG. 1C shows a sectional view taken along line B-B' of FIG. 1A.

According to the embodiment of FIGS. 1A to 1C, the semiconductor device may include a stacked structure including conductive layers 14 and insulating layers (not shown) and through-structures passing through the stacked structure. Here, each of the through-structures may include a channel layer 11 and a memory layer (not shown). Also, each of the conductive layers 14 may include a plurality of gate electrodes 12 and a gate line 13 electrically connecting the plurality of gate electrodes 12 to each other.

Each of the channel layers 11 may be a channel layer of a memory cell, a select transistor, or the like. The channel layer 11 may include a semiconductor material, such as silicon Si or germanium (Ge). For example, the channel layer 11 may have a pillar shape passing through the alternately stacked conductive layers and insulating layers. In an embodiment, the channel layer 11 may have the same width at upper and lower portions thereof. However, the invention is not limited in this way. For example, the channel layer 11 may have a narrowed width a it comes closer to the lower portion thereof. Otherwise, the channel layer may be tapered with a narrower width at its lower end. The channel layer 11 may have a shape filled up to its center, a shape having an open center, or a shape having a combination thereof.

The channel layers 11 may be arranged in a first direction I-I' and a second direction II-II' intersecting the first direction I-I'. Here, the second direction II-II' is tilted at a predetermined angle θ from the first direction I-I'. For example, the second direction II-II' may be tilted at an angle smaller than 90° to intersect the first direction I-I'. In this case, the channel layers 11 are arranged in a form in which their centers are offset to cross each other, e.g., a zigzag form.

The channel layers 11 are arranged at predetermined distances, and the distances between the channel layers 11 may be equal to or different from each other depending on a direction. For example, the neighboring channel layers 11 in the first direction I-I' are spaced apart from each other at a first distance W1, and the neighboring channel layers 11 in the second direction II-II' are spaced apart from each other at a second distance W2. The first distance W1 may be the same as the second distance W2, or may be greater than the second distance W2.

The gate electrodes 12 may be cylindrical metal patterns surrounding the sidewalls of the channel layers 11, respectively, and may be stacked while being spaced apart from each other at a predetermined distance along the length direction of the channel layers 11. Insulating layers (not shown) are interposed between the stacked gate electrodes 12 in order to insulate the vertically neighboring gate electrodes 12. Each of the gate electrodes 12 may be a gate electrode of a memory cell or a gate electrode of a select transistor. The gate electrode 12 may include any suitable metal, such as, for example, tungsten W.

Here, the gate electrodes 12 positioned at the same height may be spaced apart from or contacted with each other depending on thicknesses T1 and T2 of the gate electrodes 12. For example, when the distance W2 between neighboring channel layers 11 is smaller than the sum T1+T2 of the thicknesses of the neighboring gate electrodes 12, the neighboring gate electrodes 12 are directly contacted with each other. On the other hand, when the distance W1 between neighboring channel layers 11 is greater than the sum T1+T2 of the thicknesses of the neighboring gate electrodes 12 the neighboring gate electrodes 12 are isolated from each other. Thus, if the first distance W1 has a larger value than the second distance W2, the sum T1+T2 of the thicknesses of neighboring gate electrodes 12 in the first direction I-I' is smaller than the first distance W1, and the sum T1+T2 of the thicknesses of neighboring gate electrodes 12 in the second direction II-II' is greater than the second distance W2, the neighboring gate electrodes 12 in the first direction I-I' are spaced apart from each other, and the neighboring gate electrodes 12 in the second direction II-II' are contacted with each other.

The gate line 13 may be a metal line connecting the gate electrodes 12 to each other while surrounding sidewalls of the gate electrodes 12. For example, the gate line 13 may be a word line connecting gate electrodes of a memory cell to each other or a select line connecting gate electrodes of a select transistor to each other. The gate lines 13 electrically connect the gate electrodes 12 positioned at the same height, and may be stacked in a multi-layered structure. Here, vertically stacked gate lines 13 are insulated from each other by an insulating layer (not shown) interposed therebetween.

Each of the gate lines 13 includes at least two channel columns, and may electrically connect the gate electrodes 12 of the channel columns to each other. Each channel column includes channel layers 11 arranged in the first direction I-I'. For example the gate lines 13 positioned in a memory block MB may include two channel columns, and the gate line 13 positioned at an edge of the memory block MB may include one channel column. Here, the memory block MB is a unit in which data is erased through an erase operation of the semiconductor device.

When the neighboring gate electrodes 12 in the first direction I-I' or the second direction II-II' are spaced apart from each other, the gate line 13 may fill in spaces between the neighboring gate electrodes 12. For example, the gate line 13 may fill in the spaces between the neighboring gate electrodes 12 in the first direction I-I' and extend in the first direction I-I'.

The gate line 13 may include any suitable metal, such as, for example tungsten W. We note that the gate electrodes 12 and the gate line 13 may include the same metal or may include different metals.

The semiconductor device may further include slit insulating layers 15 and 16 passing through the stacked structure. The slit insulating layers 1 and 16 insulate the conductive layers 14 positioned at the same height from each other, and may extend in the first direction I-I'. The slit insulating layers 15 and 16 may have various shapes and depths depending on their forming positions and usages. For example, a first slit insulating layer 15 is positioned at a boundary between neighboring memory blocks MB, and may have a depth where it completely passes through the stacked structure. A second slit insulating layer 16 is positioned in the memory block MB, and may completely pass through or partially pass through the stacked structure.

For reference, the semiconductor device may further include memory layers (not shown) interposed between the channel layers 11 and the gate electrodes 12. Each of the memory layers may include a tunnel insulating layer, a data storage layer, and a charge blocking layer. The data storage layer may include silicon, nitride, phase-change material, nano-dot, and the like. In addition, barrier patterns (not shown) may be interposed between the memory layers and the gate electrodes 12. The barrier patterns may include titanium (Ti), tantalum (Ta), titanium nitride (TiN), tantalum nitride (TaN), and the like.

According to the structure described above, a plurality of gate electrodes 12 surround sidewalls of channel layers 11, respectively, and empty space between the plurality of gate electrodes 12 is filled by one gate line 13, so that the plurality of gate electrodes 12 are electrically connected to each other. Thus, a conductive material (i.e., the gate electrode and the gate line) may be filled without any empty space between stacked insulating layers.

In addition, the gate electrodes 12 and the gate lines 13 may include a metal. Therefore, insulating layers and metal layers are alternately stacked, and each of the metal layers may include a plurality of metal patterns and a metal line electrically connecting the metal patterns to each other. Thus, the resistance of the gate electrodes 12 and the resistance of the gate lines 13 can be reduced, thereby improving loading characteristics.

FIGS. 2A to 2C are views illustrating a structure of a semiconductor device according to an embodiment of the present invention. Particularly, FIG. 2A shows a layout of gate electrodes and gate lines, FIG. 25 shows a sectional view taken along line A-A' of FIG. 2A, and FIG. 2C shows a sectional view taken along line B-B' of FIG. 2A. Hereinafter, contents overlapping with those described above will be omitted.

Referring to FIGS. 2A to 2C, a first distance W1 between neighboring channel layers 11 in a first direction I-I' may be substantially equal to a second width W2 between neighboring channel layers 11 in the second direction II-II'.

The first distance W1 may be substantially equal to or smaller than the sum T1+T2 of the thicknesses of neighboring gate electrodes 12 in the first direction I-I'. In this case, the neighboring gate electrodes 12 in the first direction I-I' are directly contacted with each other. In addition, the second distance W2 may be substantially equal to or smaller than the sum T1+T2 of the thicknesses of neighboring gate electrodes 12 in a second direction II-II'. In this case, the neighboring gate electrodes 12 in the second direction II-II' may be directly contacted with each other.

According to the structure illustrated in FIGS. 2A to 2C and described above, spaces between the channel layers 11 are completely filled with the gate electrode 12.

FIGS. 3A to 11A, 3B to 11B, and 9C to 11C are sectional views illustrating a manufacturing method of a semiconductor device according to an embodiment of the present invention. Each of FIGS. 3A to 11A shows a sectional view taken along line A-A', each of FIGS. 3B to 11B shows a sectional view taken along line B-B', and each of FIGS. 9C to 11C shows a plan view.

Figure 3A:
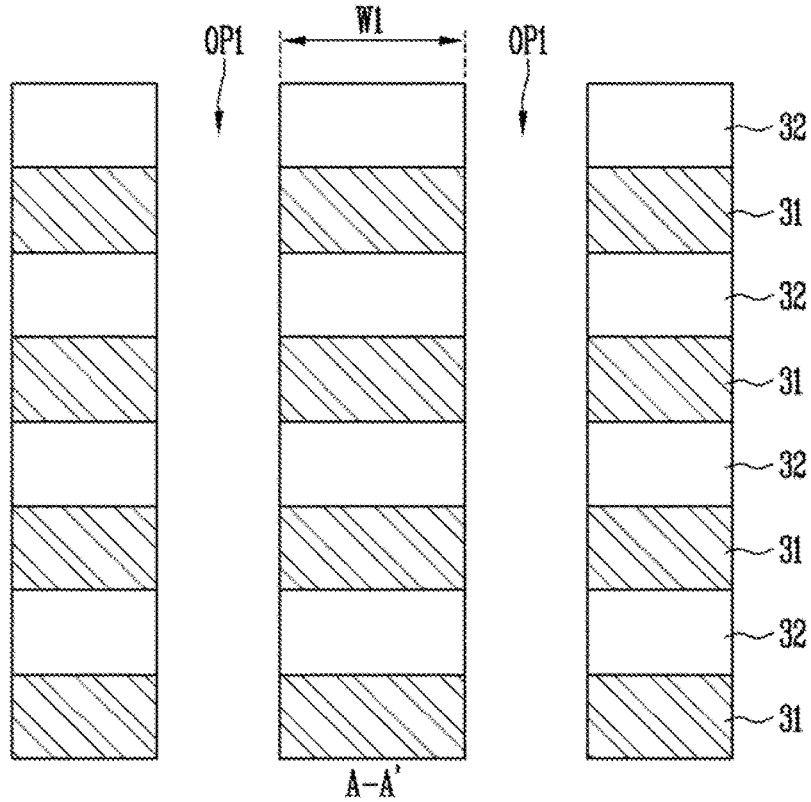
Figure 3B:
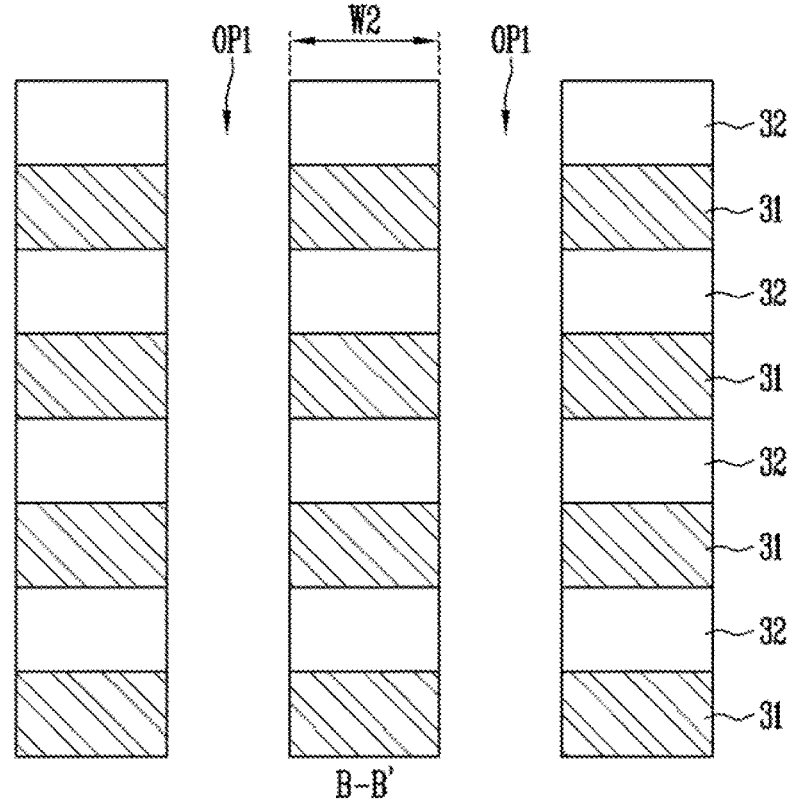

Referring to FIGS. 3A and 3B, a stacked structure is formed by alternately stacking sacrificial layers 31 and insulating layers 32. Here, the sacrificial layers 31 employed for forming gate electrodes and gate lines of memory cells or select transistors, and the insulating layers 32 are used to insulate the stacked gate electrodes and gate lines from each other.

The sacrificial layers 31 may include a material having a large etching selection ratio with respect to the insulating layers 32. For example, the sacrificial layers 31 may include a nitride and the insulating layers 32 may include an oxide. The sacrificial layers 31 and the insulating layers 32 may be formed with a substantially equal thickness or different thicknesses. Here, the term substantially equal represents a dimension falling within a range including an error that may occur in a manufacturing process.

Subsequently, first openings Opt passing through the sacrificial layers 31 and the insulating layers 32 are formed. The first openings OP1 are employed for forming channel layers and memory layers, and may be formed to have a depth where they completely pass through the stacked structure. Each of the first openings OP1 may have the same width at upper and lower portions thereof. Each of the first openings OP1 may have a width narrowed as it comes closer to the lower portions thereof. In another embodiment, each of the first openings OP1 may be tapered. Each of the first openings OP1 may have any suitable cross-section, such as, for example, a circular cross-section, an elliptical cross-section, a quadrangular cross section, a polygonal cross section and the like. In an embodiment, each of the first openings OP1 has an elongated cylindrical shape of a constant cyclical cross-section. In yet another specific embodiment each of the first openings OP has an elongated cylindrical shape that is tapered with a narrower width (or cross-sectional diameter) at a bottom end thereof and a wider width (or cross-sectional diameter) at a top end thereof. Many other configurations of the first openings may be employed.

The first openings OP1 may be arranged in a first direction I-I' and a second direction II-II' intersecting the first direction I-I'. Here, a first distance W1 between neighboring first openings OP1 in the first direction I-I' may be substantially equal to or greater than a second distance W2 between neighboring first openings OP1 in the second direction II-II'. In this embodiment, a case where the first distance W1 is greater than the second distance W2 will be described.

Figure 4A:
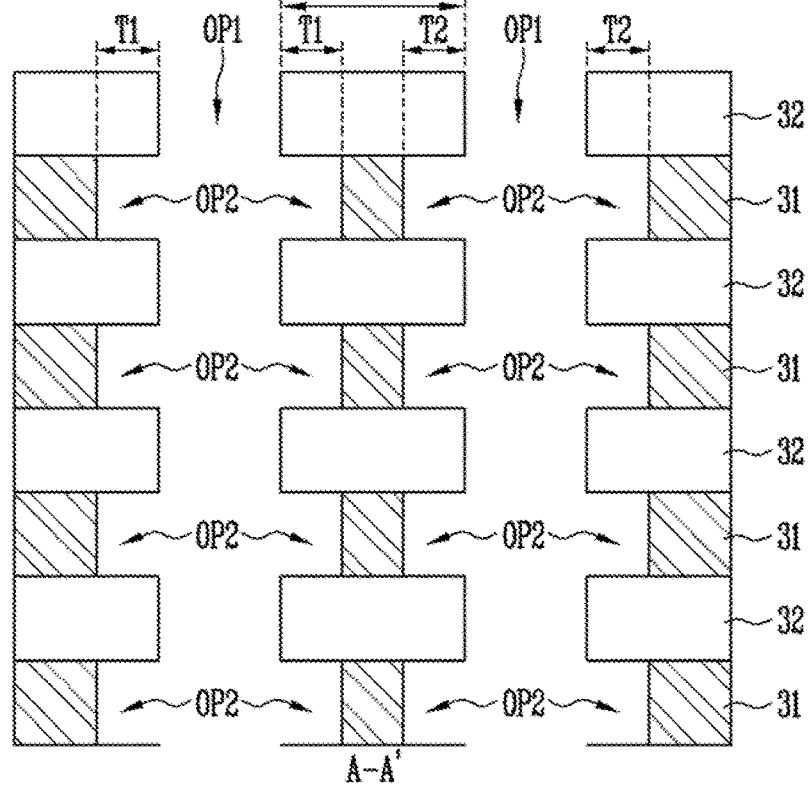
Figure 4B:
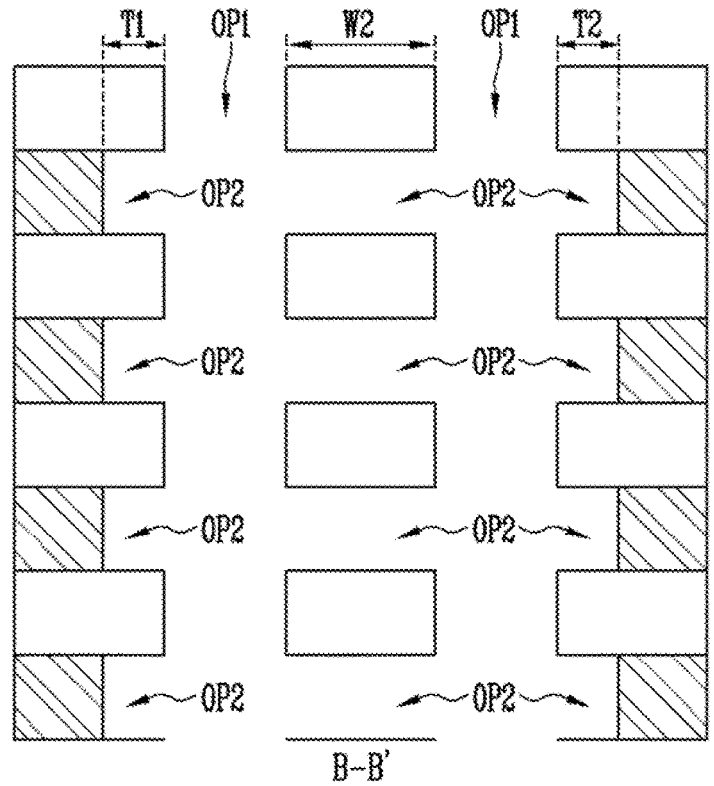

Referring to FIGS. 4A and 4B, second openings OP2 are formed by partially removing the sacrificial layers 31 through the first openings OP1. Here, the second openings OP2 are employed for forming gate electrodes in a subsequent process. Since the sacrificial layers 31 are removed through the first openings OP1, the sacrificial layers 31 around the openings OP1 can be easily removed.

Thicknesses T1 and T2 of the second openings OP2 may be determined according to the distances W1 and W2 between the neighboring first openings OP1. When the first distance W1 between the neighboring first openings OP1 in the first direction I-I' is greater than a sum (T1+T2) of the thicknesses of neighboring second openings OP2 in the first direction I-I', the sacrificial layers 31 may remain between the second openings OP2. That is, the neighboring second openings OP2 in the first direction I-I' are isolated from each other. When the second distance W2 between the neighboring first openings OP1 in the second direction II-II' is substantially equal to or smaller than a sum (T1+T2) of the thicknesses of neighboring second openings OP2 in the second direction II-II', the sacrificial layers 31 between the second openings OP2 are entirely removed so that the second openings OP2 can be connected to each other.

Figure 5A:
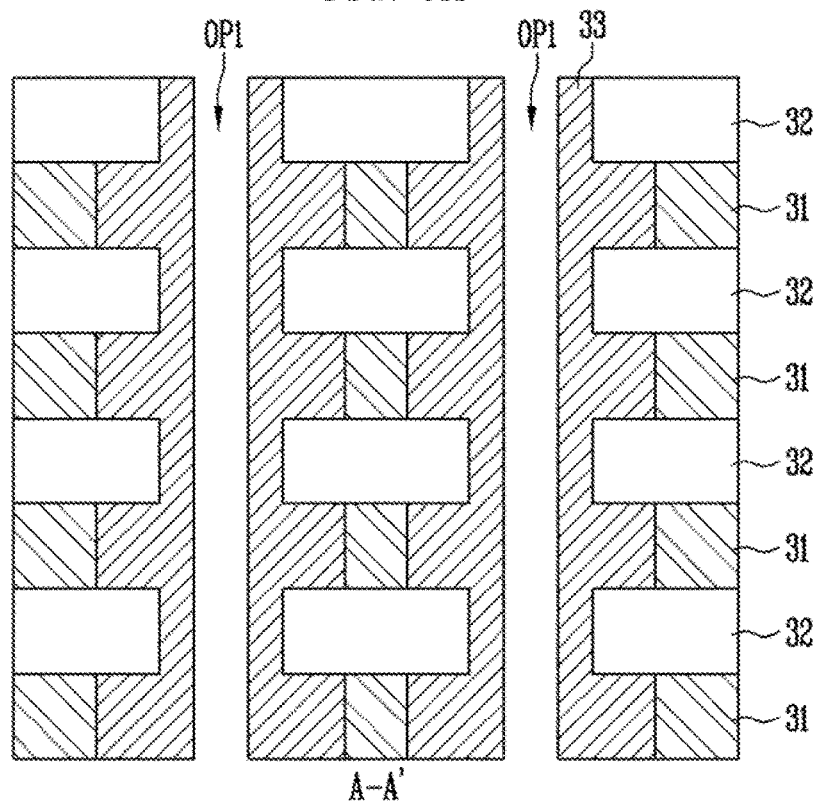
Figure 5B:
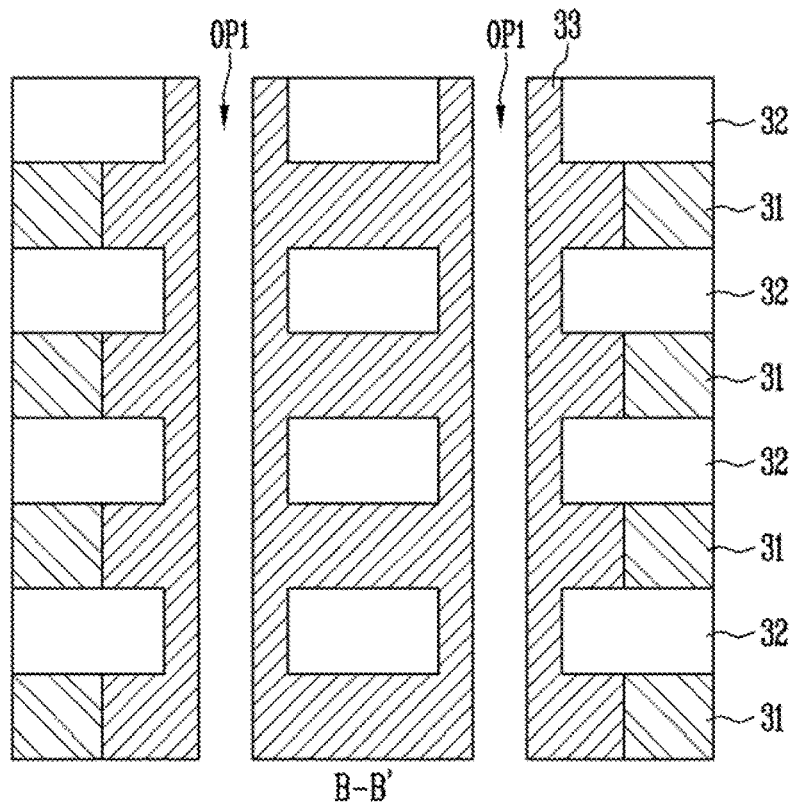

Referring to FIGS. 5A and 5B, a conductive layer 3 for gate electrodes is formed in the first openings OP1 and the second openings OP2. For example, the conductive layer 33 for gate electrodes may be a metal layer including any suitable metal, such as, for example, tungsten (W), and/or tungsten nitride (WN$_x$). Here, the conductive layer 33 for gate electrodes may be formed to have a thickness where it completely fills in the second openings OP2 and opens central areas of the first openings OP1.

Figure 6A:
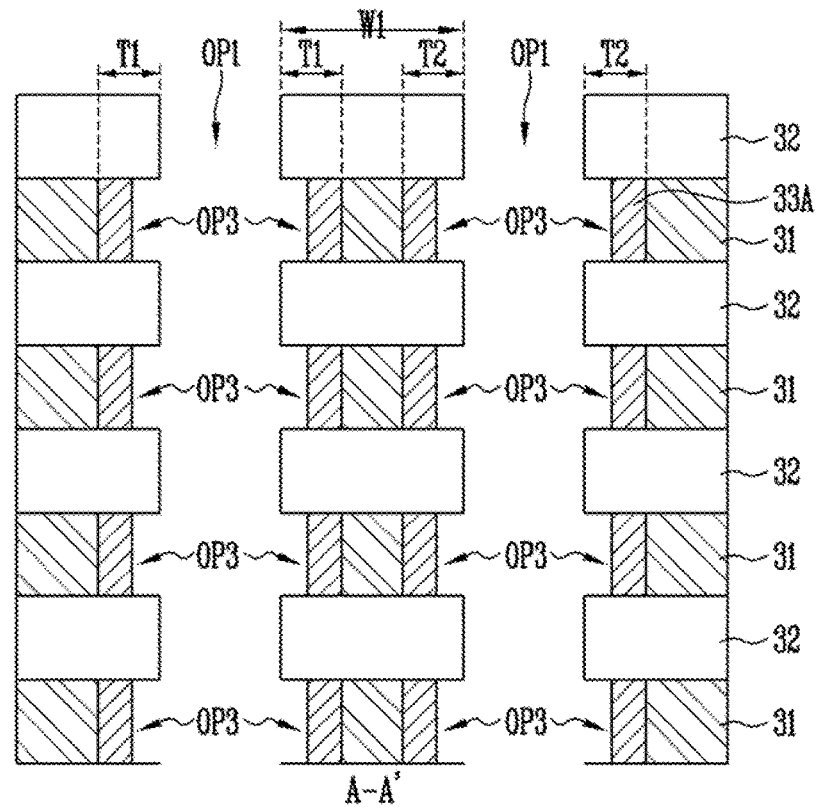
Figure 6B:
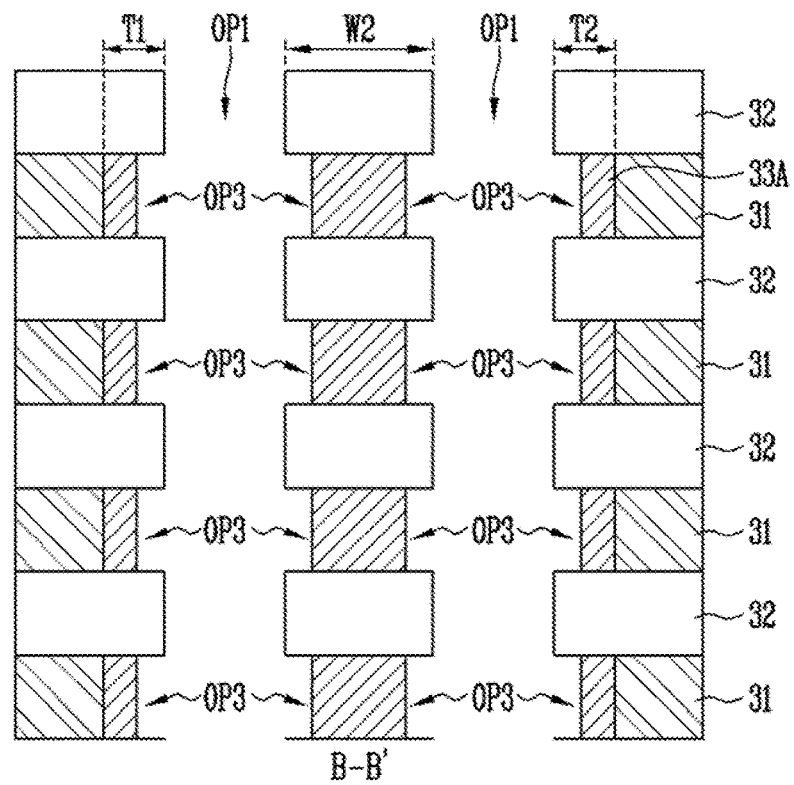

Referring to FIGS. 6A and 6B, the conductive layer 33 for gate electrodes formed in the first openings OP1 is removed, thereby forming gate electrodes 33A respectively positioned in the second openings OP2, When the conductive layer for gate electrodes is a metal layer, the gate electrodes 33A may be metal patterns. Also, the gate electrodes 33A may have a cylindrical shape having the same axis as channel layers which will be formed in a subsequent process.

Here, when the first distance W1 between the neighboring first openings OP1 in the first direction I-I' is greater than the sum T1+T2 of the thicknesses of the second openings OP2, neighboring gate electrodes 33A in the first direction I-I' are isolated from each other. When the second distance W2 between the neighboring first openings OP1 in the second direction II-II' is equal to or smaller than the sum T1+T2 of the thicknesses of the second openings OP2 neighboring gate electrodes 33A in the second direction II-II' are directly contacted with each other.

For reference, when the gate electrodes 33A are formed, third openings OP3 may be formed by partially removing the gate electrodes 33A in the second openings OP2.

Accordingly, the stacked gate electrodes 33A are connected to each other in order to prevent the occurrence of a bridge.

Figure 7A:
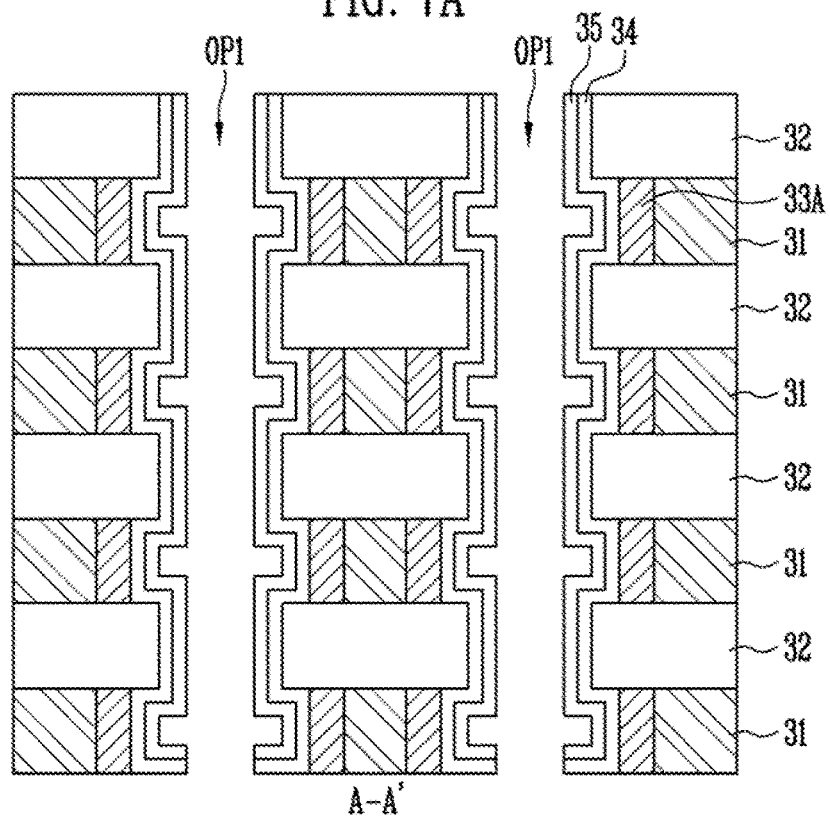
Figure 7B:
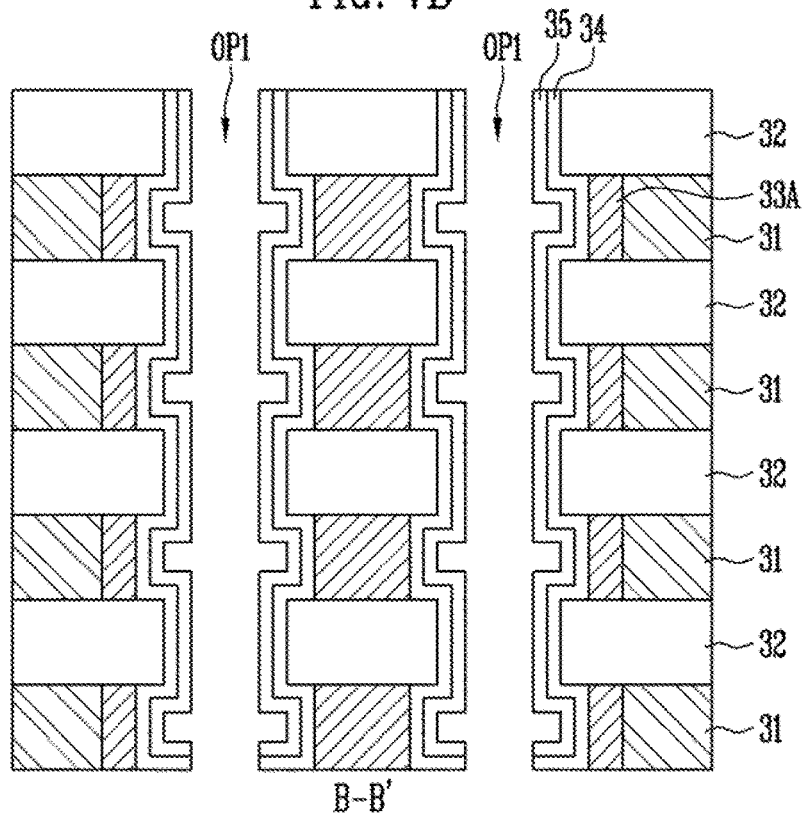

Referring to FIGS. 7A and 7B, a barrier layer 34 and a first memory layer 35 are formed in the first openings OP1. The barrier layer 34 and the first memory layer 35 are formed along inner walls of the first openings OP1, and may be formed in the third openings OP3.

The barrier layer 34 may include, for example, titanium (Ti), tantalum (Ta), titanium nitride (Tin), tantalum nitride (TaN), and the like. The first memory layer 35 may include at least one of a charge blocking layer, a data storage layer, and a tunnel insulating layer. For example, the first memory layer 35 may be a charge blocking layer including a high dielectric constant (high-k) material, such as, for example aluminum oxide ($Al_2O_3$).

Figure 8A:
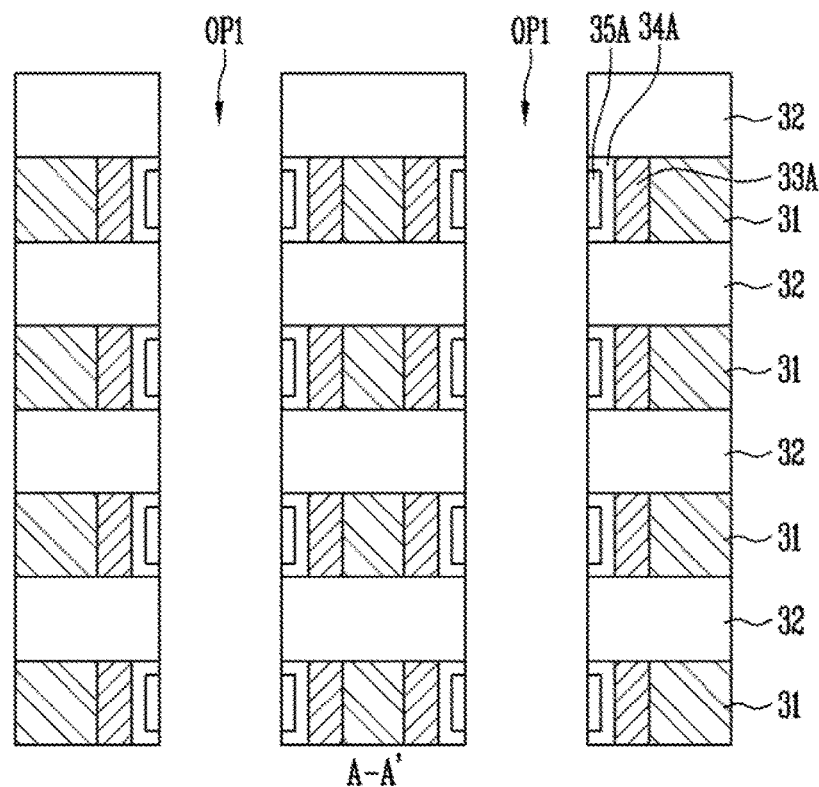
Figure 8B:
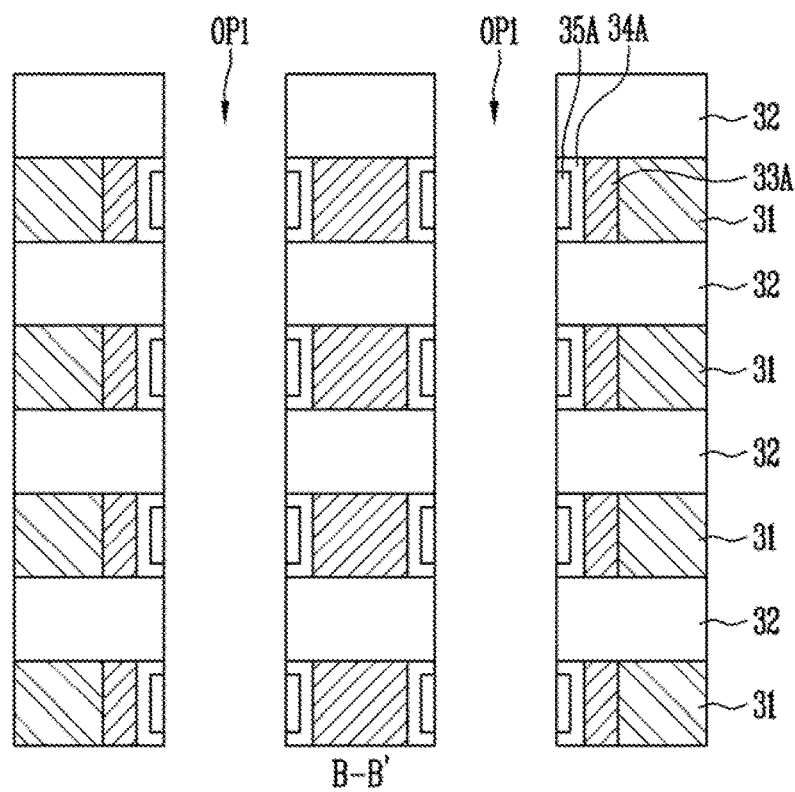

Referring to FIGS. 8A and 8B, the barrier layer 34 and the first memory layer 35, formed in the first openings OP1, are removed, thereby forming barrier patterns 34A and first memory patterns 35A, which are respectively positioned in the third openings OP3. Here, the first memory patterns 35A, the barrier patterns 34A, and the gate electrodes 33A are formed in an area from which the sacrificial layers 31 are removed. Therefore, the first memory patterns 35A, the barrier patterns 34A, and the gate electrodes 33A are positioned at substantially equal height.

Figure 9A:
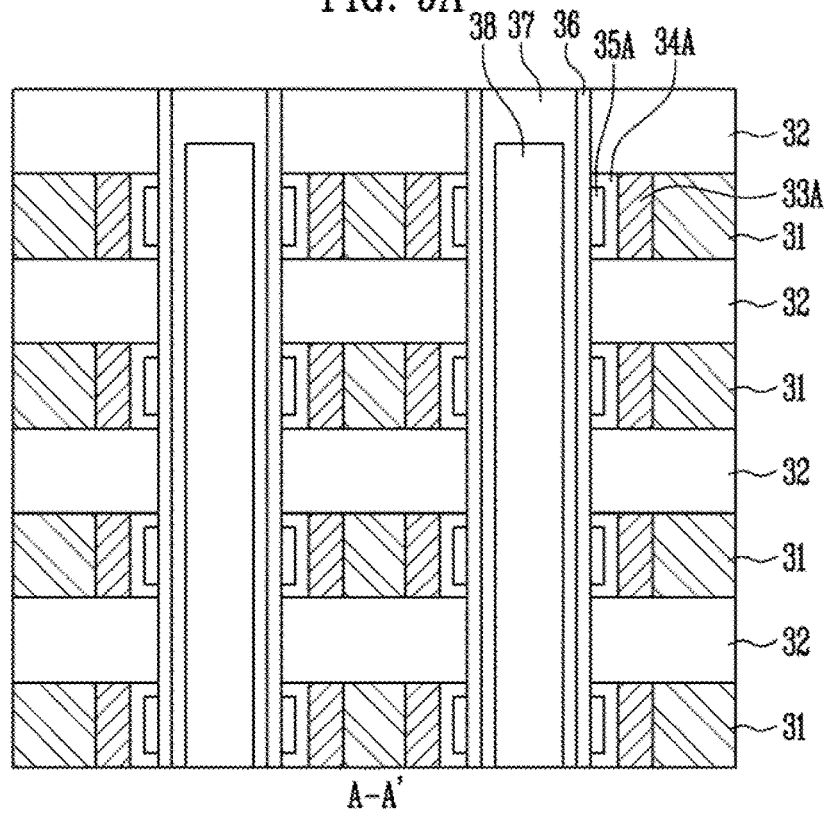
Figure 9B:
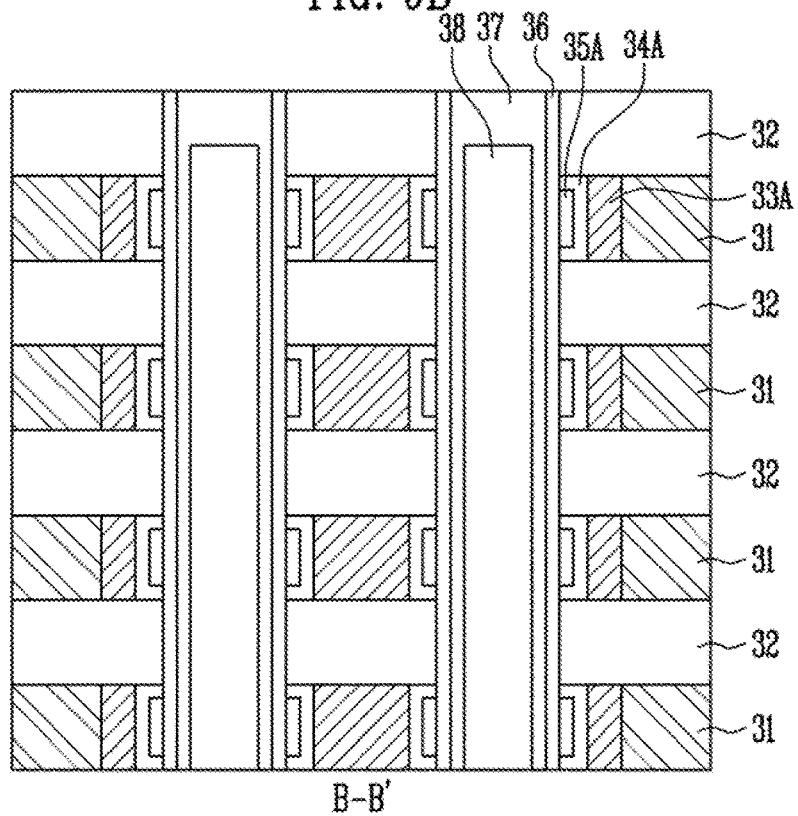
Figure 9C:
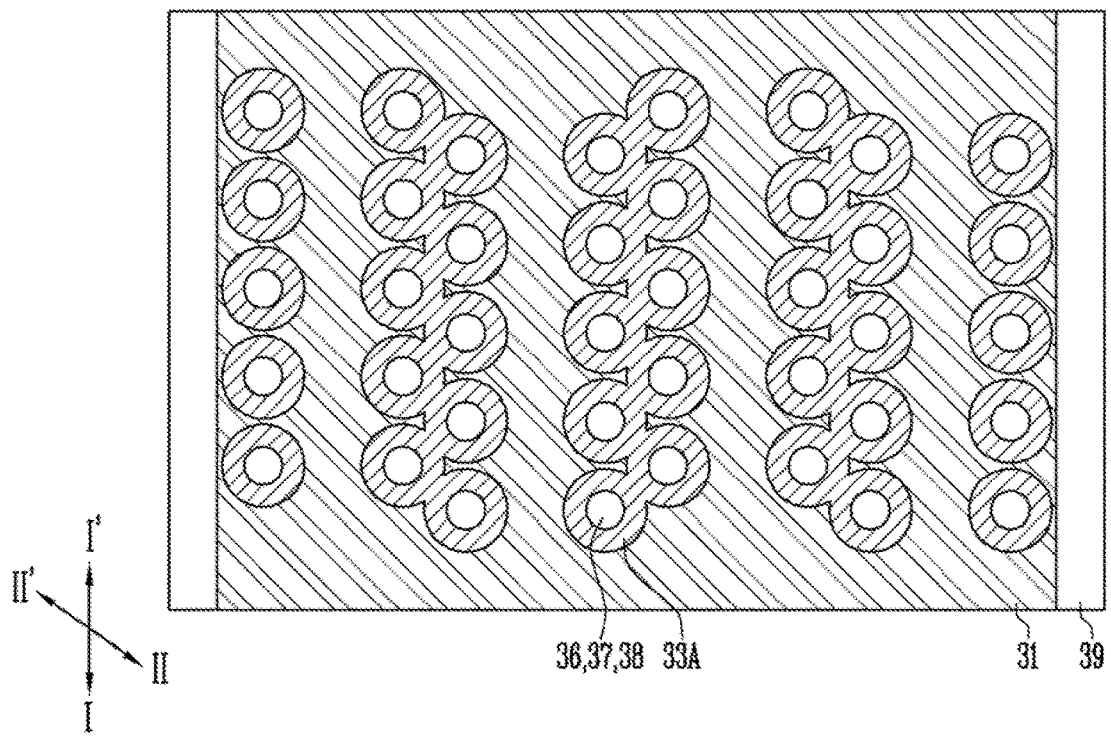

Referring to FIGS. 9A to 9C, a second memory layer 36 formed in the first openings OP1, and then a channel layer 37 is formed. Subsequently, when the channel layer 37 has an open central area, a gap-fill insulating layer 38 is formed in the open central area. The second memory layer 36 may include at least one of a charge blocking layer, a data storage layer, and a tunnel insulating layer. The data storage layer may include silicon, nitride phase-change material, nano-dot, and the like.

For reference, in FIG. 9C, the second memory layer 36, the channel layer 37, and the gap-fill insulating layer 38 are illustrated as one layer for convenience of illustration. In addition, a first slit insulating layer 39 may pass through the sacrificial layers 31 and the insulating layers 32 and extend in the first direction I-I'. The first slit insulating layer 39 may be positioned at a boundary between neighboring memory blocks MB. The first slit insulating layer 39 may be formed before the first openings OP1 are formed.

Figure 10A:
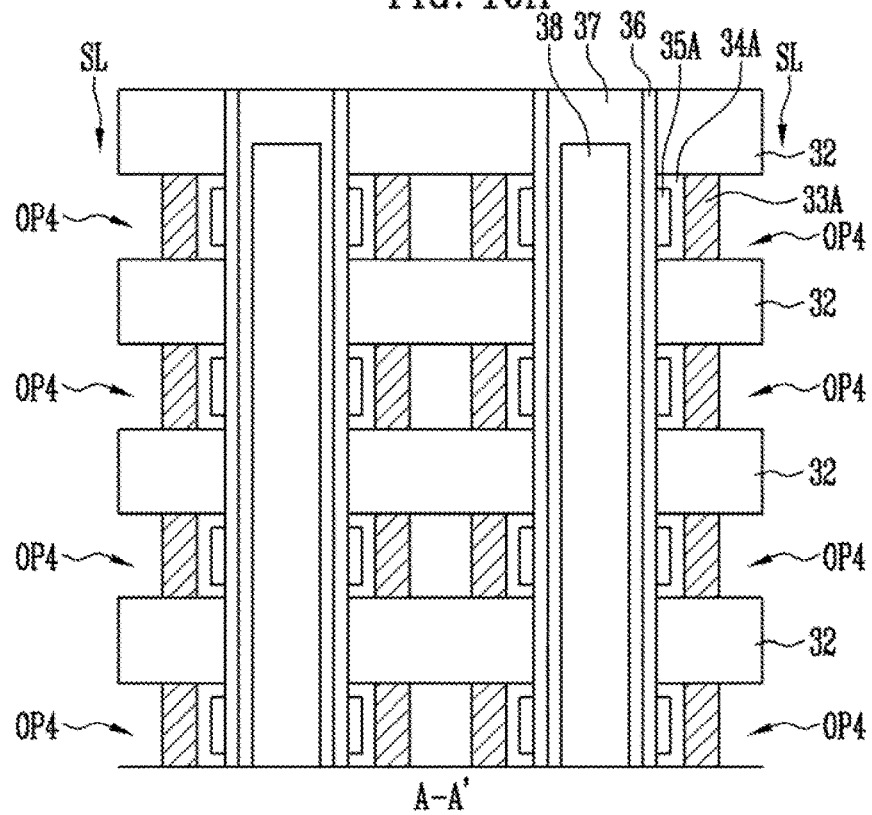
Figure 10B:
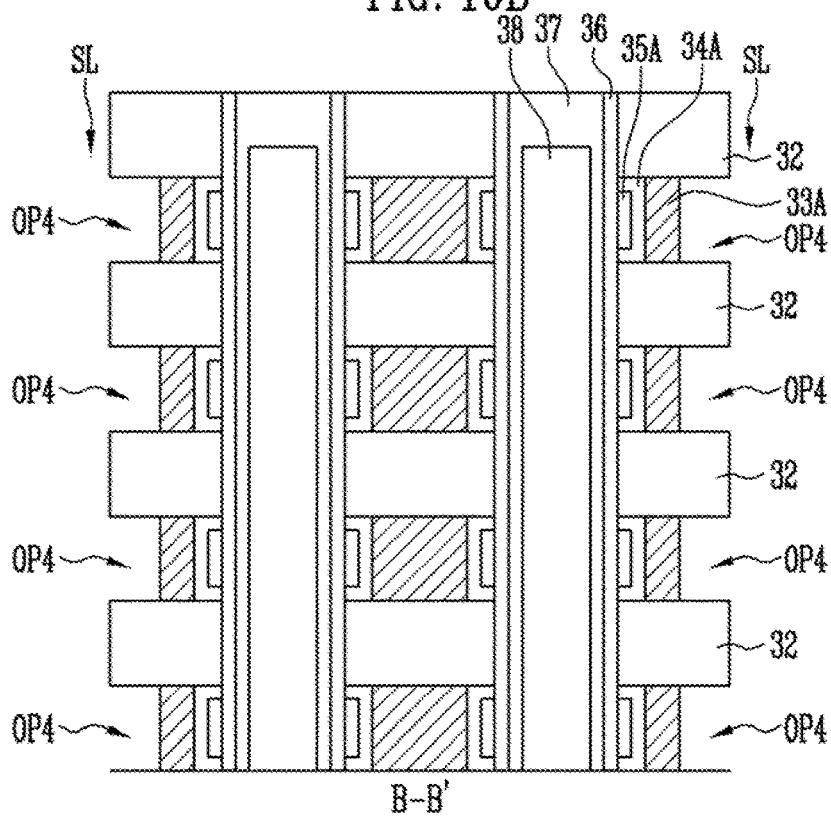
Figure 10C:
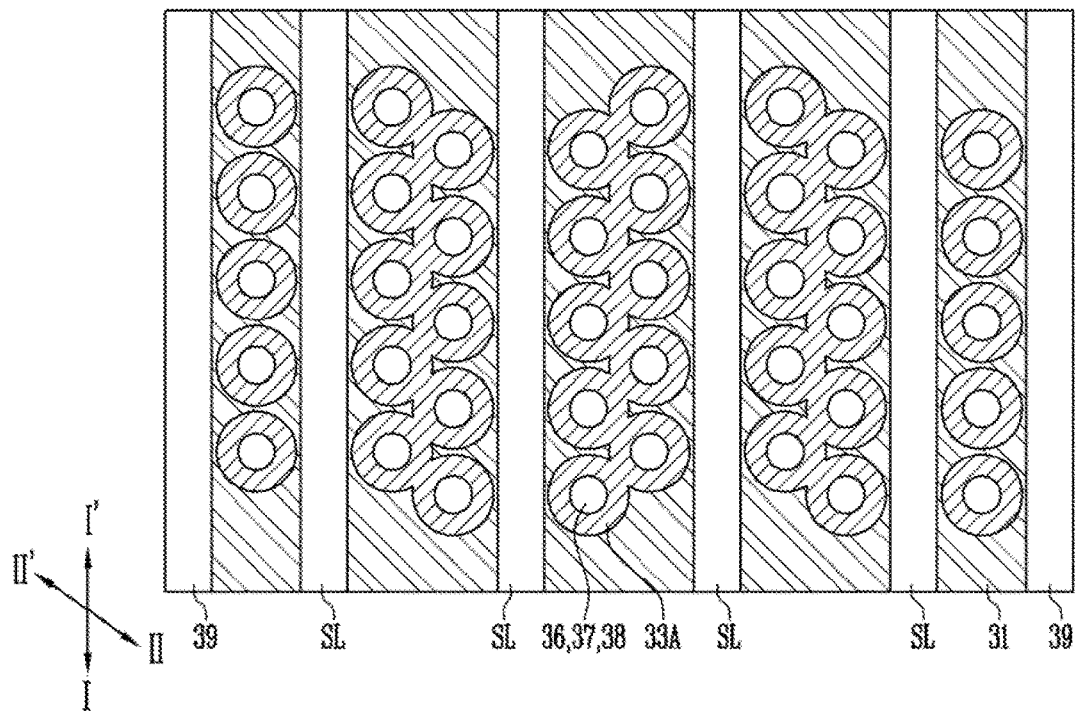

Referring to FIGS. 10A to 10C, a slit SL passing through the sacrificial layers 31 and the insulating layers 32 is formed, and then fourth openings OP4 are formed by removing the sacrificial layers 31 exposed through the slit SL. In an area distant from the slit SL (e.g., an area between neighboring channel layers 37 in the second direction I-II'), the sacrificial layers 31 have already been replaced with the gate electrodes 33A, and, hence, the sacrificial layers 31 remaining n an area close to the slit SL are removed.

Referring to FIGS. 11A to 11C, gate lines 40 are formed in the respective fourth openings OP4 through the slit SL, and then a second slit insulating layer 41 is formed in the slit SL. Here, the fourth openings OP4 are positioned close to the slit SL, and thus the gate lines 40 can be formed in the fourth openings OP4 without any void. For example, the gate lines 40 are directly contacted with the gate electrodes 33A through the fourth openings OP4, respectively, and electrically connect the gate electrodes 33A. Also, the gate lines 40 extend in the first direction I-I' while respectively filling the fourth openings OP4 between the neighboring gate electrodes 33A in the first direction I-I'. The gate lines 40 may be metal lines including any suitable metal, such as, for example, tungsten (W), tungsten nitride (WN$_x$).

According to the manufacturing method described above, after the sacrificial layers 31 around the channel layers 37 are replaced with the gate electrodes 33A, the remaining sacrificial layers 31 may be replaced with the gate lines 40. Since the sacrificial layers 31 around the channel layers 37 are distant from the slit SL, it is generally difficult to remove the sacrificial layers 31 through the slit SL and fill a metal layer in the area from which the sacrificial layers 31 are removed. Hence, voids are generated around the channel layers 37, and a gas remains in the voids. Therefore, peripheral layers may be damaged. On the other hand, according to the embodiment of the present disclosure, the sacrificial layers 31 around the channel layers 37 have already been removed and replaced with the metal layer, thus preventing voids from being generated between the channel layers 37. Accordingly, the metal layer can be completely filled between the stacked insulating layers 32.

Meanwhile, the shapes of the gate electrodes 33A and the gate lines 40 may be changed depending on arrangements of the first openings OP1, distances between the first openings OP1 and thicknesses of the second openings OP2. For example, the gate electrodes 33A may be completely filled between the neighboring first openings OP1 in the second direction II-II'.

FIG. 12 is a block diagram illustrating a configuration of a memory system, according to an embodiment of the present invention According to the embodiment of FIG. 12, the memory system 1000 may include a memory device 1200 and a controller 1100.

The memory device 1200 is employed for storing data information having various data formats, such as, for example, texts graphics, and software codes. The memory device 1200 may be a nonvolatile memory, and may include the structures described with reference to FIGS. 1A to 11C. In addition, the memory device 1200 is configured to include channel layers arranged in a first direction and a second direction intersecting the first direction; stacked insulating layers surrounding sidewalls of the channel layers; stacked gate electrodes interposed between the insulating layers to respectively surround the channel layers; and stacked gate lines interposed between the insulating layers to electrically connect the gate electrodes to each other. The structure and manufacturing method of the memory device 1200 are the same as described above, and therefore, their detailed descriptions will be omitted.

The controller 1100 is connected to a host and the memory device 1200 and configured to access the memory device 1200 in response to a request from the host. For example, the controller 1100 is configured to control reading, writing, erasing, and background operations of the memory device 1200.

The controller 1100 may be any suitable controller and may, for example, include a random access memory (RAM) 1110, a central processing unit (CPU) 1120, a host interface 1130, an error correction code (ECC) circuit 1140, a memory interface 1150, as illustrated in the embodiment of FIG. 12. The controller 1100 may include other units as may be needed which are well known in the relevant art.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 is configured to control that overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 according to the embodiment of the present disclosure includes the memory device 1200 having a stable structure and improved loading characteristics, and thus it is possible to improve characteristics of the memory system 1000.

FIG. 13 is a block diagram illustrating a configuration of a memory system according to an embodiment of the present invention. Hereinafter, contents overlapping with those described above will be omitted.

According to the embodiment of FIG. 13, the memory system 1000' may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory, and may include memory strings described with reference to FIGS. 1A to 11C. In addition, the memory device 1200 is configured to include channel layers arranged in a first direction and a second direction intersecting the first direction; stacked insulating layers surrounding sidewalls of the channel layers; stacked gate electrodes interposed between the insulating layers to respectively surround the channel layers; and stacked gate lines interposed between the insulating layers to electrically connect the gate electrodes to each other. The structure and manufacturing method of the memory device 1200' are the same as described above, and therefore, their detailed descriptions will be omitted.

The memory device 1200 may be a multi-chip package including a plurality of memory chips. The plurality of memory chips may be divided into a plurality of groups which are configured to communicate with the controller 1100 over first to kth channels (CH1 to CHk). In addition, memory chips included in one group may be configured to communicate with the controller 1100 over a common channel. For reference, the memory system 1000' may be modified so that one memory chip is connected to one channel.

As described above, the memory system 1000' according to the embodiment of the present disclosure includes the memory device 1200' having a stable structure and improved loading characteristics, and thus it is possible to improve characteristics of the memory system 1000'. Particularly, the memory device 1200' is configured as a multi-chip package for increasing the data storage capacity of the memory system 1000' and for improving the operation speed of the memory system 1000'.

FIG. 14 is a block diagram illustrating a configuration of a computing system, according to an embodiment of the present invention According to the embodiment of FIG. 14, the computing system 2000 may include a memory device 2100, a CPU 2200, a RAM 2300, a user interface 2400, a power source 2500, and a system bus 2600.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

Here, the memory device 2100 may be a nonvolatile memory, and may include memory strings described with reference to FIGS. 1A to 11C. In addition, the memory device 2100 is configured to include channel layers arranged in a first direction and a second direction intersecting the first direction; stacked insulating layers surrounding sidewalls of the channel layers; stacked gate electrodes interposed between the insulating layers to respectively surround the channel layers; and stacked gate lines interposed between the insulating layers to electrically connect the gate electrodes to each other. The structure and manufacturing method of the memory device 2100 are the same as described above, and therefore, their detailed descriptions will be omitted.

The memory device 2100 may be a multi-chip package including a plurality of memory chips as described with reference to FIG. 13.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, and the like.

As described above, the computing system 2000 according to the embodiment of the present disclosure includes the memory device 2100 having a stable structure and improved loading characteristics, and thus it is possible to improve characteristics of the computing system 2000.

FIG. 15 is a block diagram illustrating a computing system according to an embodiment of the present invention.

The computing system 3000, according to the embodiment of FIG. 15, may include a software layer including an operating system 3200, an application 3100, a file system 3300, a translation layer 3400, and the like. In addition, the computing system 3000 may include a hardware layer of a memory device 3500.

The operating system 3200 may manage software and or hardware resources of the computing system 3000, and control the program execution of a central processing unit. The application 3100 is one of a variety of application programs running on the computing system 3000, and may be a utility executed by the operating system 3200.

The file system 3300 may be or include a logical structure for managing data, files, and the like in the computing system 3000, and organize the data or files stored in the memory device 3500 according to a preset rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In the embodiment of FIG. 15, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL) and the like.

The memory device 3500 may be a nonvolatile memory. The memory device 3500 may include memory strings described with reference to FIGS. 1A to 11C. The memory device 3500 may be configured to include channel layers arranged in a first direction and a second direction intersecting the first direction; stacked insulating layers surrounding sidewalls of the channel layers; stacked gate electrodes interposed between the insulating layers to respectively surround the channel layers; and stacked gate lines interposed between the insulating layers to electrically connect the gate electrodes to each other. The structure and manufacturing method of the memory device 3500 may be the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present disclosure includes the memory device 3500 having a stable structure and improved loading characteristics, and thus it is possible to improve characteristics of the computing system 3000.

According to the present disclosure, gate electrodes surround sidewalls of channel layers, respectively, and gate electrodes are electrically connected by a gate line. In addition the gate electrodes have a cylindrical shape, and the gate electrodes and the gate line include a metal. Thus, the resistances of the gate electrodes and of gate line are reduced, thereby improving loading characteristics of the memory cells and select transistors.

Also, stacked sacrificial layers are partially removed using an opening for channel layers, and gate electrodes are formed in an area from which the sacrificial layers are removed. Thus, it is possible to prevent a reaction gas from remaining in the process of replacing the sacrificial layers with the gate electrodes. Accordingly, it is possible to prevent damage of peripheral layers and to prevent degradation of characteristics of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and/or scope of the present disclosure as set forth in the following claims.

What is claimed is:

1. A semiconductor device comprising:
channel layers arranged in a first direction and a second direction intersecting the first direction;
stacked insulating layers surrounding sidewalls of the channel layers;
stacked gate electrodes interposed between the insulating layers, the gate electrodes respectively surrounding the channel layers; and
stacked gate lines interposed between the insulating layers, wherein each of the gate lines is electrically coupled to corresponding gate electrodes so that an interface exists between each of the gate lines and the corresponding gate electrodes.

2. The semiconductor device of claim 1, wherein each of the gate electrodes has a cylindrical shape.

3. The semiconductor device of claim 1, wherein each of the gate lines electrically connects gate electrodes positioned in the same level to each other.

4. The semiconductor device of claim 1, wherein a distance between neighboring channel layers in the first direction is wider than a distance between neighboring channel layers in the second direction.

5. A semiconductor device comprising:
channel layers arranged in a first direction and a second direction intersecting the first direction:
stacked insulating layers surrounding sidewalls of the channel layers:
stacked gate electrodes interposed between the insulating layers, the gate electrodes respectively surrounding the channel layers; and
stacked gate lines interposed between the insulating layers, the gate lines electrically connecting the gate electrodes to each other,
wherein neighboring gate electrodes in the first direction are spaced apart from each other, and neighboring gate electrodes in the second direction are contacted with each other.

6. The semiconductor device of claim 5, wherein each of the gate lines fills between the gate electrodes spaced apart from each other in the first direction, and extends in the first direction.

7. The semiconductor device of claim 1, wherein the neighboring gate electrodes in the first direction and the second direction are contacted with each other.

8. The semiconductor device of claim 1, wherein the gate electrodes and the gate lines include a metal.

9. A semiconductor device comprising:
semiconductor pillars arranged in a first direction and a second direction intersecting the first direction;
stacked insulating layers surrounding sidewalls of the semiconductor pillars; and
metal layers alternately stacked with the insulating layers, wherein each of the metal layers includes cylindrical metal patterns respectively surrounding the sidewalls of the semiconductor pillars and a metal line surrounding sidewalls of the metal patterns so that each of the metal layers includes an interface between the metal line and the cylindrical metal patterns.

10. The semiconductor device of claim 9, wherein the metal line electrically connects metal patterns positioned in the same level to each other.

11. The semiconductor device of claim 9, wherein a distance between neighboring semiconductor pillars in the first direction is wider than a distance between neighboring semiconductor pillars in the second direction.

12. The semiconductor device of claim 9, wherein neighboring metal patterns in the first direction are spaced apart from each other, and neighboring metal patterns in the second direction are contacted with each other.

13. The semiconductor device of claim 12, wherein the metal line fills between the metal patterns spaced apart from each other in the first direction, and extends in the first direction.

14. The semiconductor device of claim 9, wherein the neighboring metal patterns in the first direction and the second direction are contacted with each other.

15. The semiconductor device of claim 9, wherein the metal patterns and the metal line include tungsten.

16. The semiconductor device of claim 9, wherein the semiconductor pillars are arranged in a zigzag form.

17. The semiconductor device of claim 9, wherein the first direction and the second direction intersect each other at an angle smaller than 90 degrees.

18. The semiconductor device of claim 9, further comprising:
memory patterns interposed between the semiconductor pillars and the metal patterns; and
barrier patterns interposed between the memory patterns and the metal patterns.

19. The semiconductor device of claim 18, wherein the memory patterns are charge blocking patterns.

20. The semiconductor device of claim 18, further comprising: memory layers surrounding the sidewalls of the semiconductor pillars, the memory layers interposed between the semiconductor pillars and the memory patterns and between the semiconductor pillars and the insulating layers.

* * * * *